United States Patent
Bergman et al.

[11] Patent Number: 5,843,235
[45] Date of Patent: Dec. 1, 1998

[54] APPARATUS FOR FORMING A DEPOSITED CURVER COATING ON A SUBSTRATE AND MIRROR

[75] Inventors: Clark Bergman, Roseville; Thomas M. Crook, New Brighton, both of Minn.

[73] Assignee: Honeywell Inc., Minneapolis, Minn.

[21] Appl. No.: 710,077

[22] Filed: Sep. 11, 1996

[51] Int. Cl.⁶ ................................................. C23C 16/04
[52] U.S. Cl. .................. 118/720; 118/504; 427/282; 427/585
[58] Field of Search .................. 427/282, 585, 427/588; 118/504, 720

[56] References Cited

U.S. PATENT DOCUMENTS 4,506,185  3/1985  Giler et al. .............................. 313/113
4,557,798  12/1985  Blanding et al. ........................ 156/660

*Primary Examiner*—Shrive Beck
*Assistant Examiner*—Fred J. Parker
*Attorney, Agent, or Firm*—Albert K. Kau; Thomas A. Rendos

[57] ABSTRACT

A substrate holder and mask system for depositing curved films and mirrors on flat mirror substrates. A spherical mask is held in close proximity to a substrate by a support structure to intercept a fraction of vapor from a distant source. The film deposited on the substrate behind the mask has a spherically symmetric curvature when the source has a large area. The cross section of the mask support structure is made as small as possible to minimize irregularities in the spherical figure. A mirror is subsequently deposited on said curved substrate after removing said mask.

14 Claims, 7 Drawing Sheets

APPARATUS FOR FORMING A DEPOSITED CURVER COATING ON A SUBSTRATE AND MIRROR

BACKGROUND OF THE INVENTION

The present invention is related to the manufacture of mirrors, and more specifically to an apparatus for forming curved mirrors.

Curved mirrors are used in ring laser gyroscopes (RLG's) to create a stable low-loss resonant path. These curved mirrors have been formed by depositing reflective materials on curved substrates. The curved substrates have been formed by traditional grinding, lapping and polishing of a flat substrate.

Furthermore, it is desirable for the mirrors of the ring laser gyros to reflect light at a certain angle after hitting the mirror. However, irregularities and flaws in the substrate surface and/or the mirror coating cause light to reflect in many undesirable angles. The undesirable reflections are referred to as scatter. The scatter decreases the accuracy of ring laser gyros.

Prior to deposition of the mirror on a substrate, the surface to be coated must be super polished. This super polish also serves to minimize scattering of laser light by the mirror. Curved substrates are more difficult to super polish than flat substrates.

SUMMARY OF THE INVENTION

The present invention is an apparatus for holding mirror substrates to produce high quality curved substrates and mirrors by vapor deposition. The apparatus includes a body, substrate holding means, the substrate holding means having an aperture which allows communication between sides of the body and a mask with a support means. The body supports at least one substrate in the substrate holding means. A mask, which may be a sphere, a disk or a cylinder, is supported over the aperture. Thin wires or bands may be used as the supports. Grooves may be cut into the mask to accept the wires or bands and thereby support it at a predetermined gap length from a substrate.

The bands or wires are fastened to the body. They may be spot welded to or supported above the body by feeding them through small holes cross-bored through a series of posts, at least one of which may be rotated axially in order to tighten the wires.

A laser mirror is subsequently deposited on the curved substrate using a substrate holding means in which the aperture is not masked.

The invention will be better understood with reference to the following description and drawings attached hereto.

BRIEF DESCRIPTION OF THE DRAWINGS

FIG. 6a is a slice-view taken along line 6A—6A of the substrate holder shown in FIG. 5a.

DETAILED DESCRIPTION OF THE PREFERRED EMBODIMENT

Figure 1:
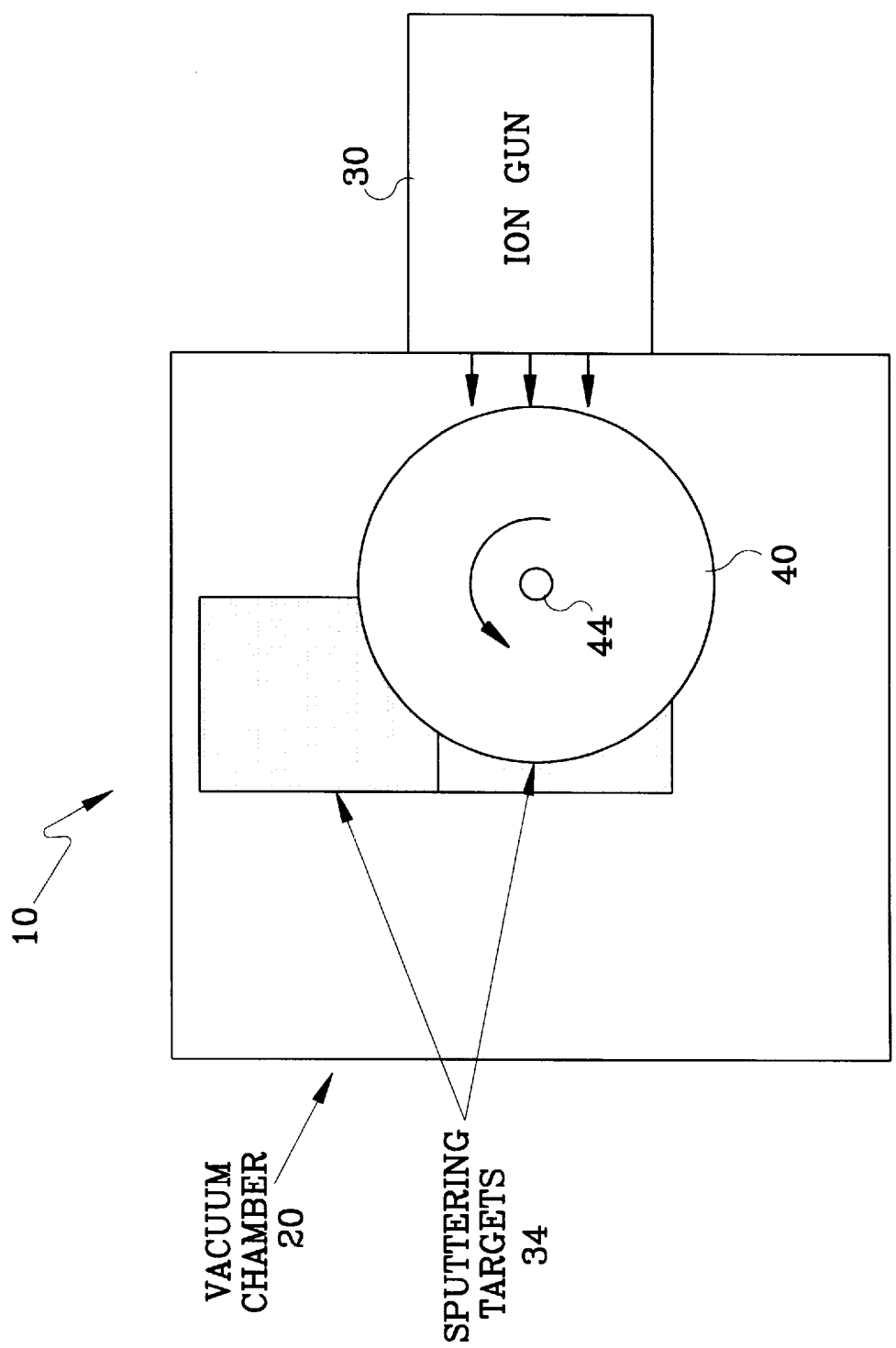
FIG. 1 is a top-view of a mirror deposition system.

FIG. 1 depicts a typical mirror deposition system 10. Mirror deposition system 10 includes vacuum chamber 20, ion gun 30, sputtering targets 34, wheel 40 and shaft 44. In operation, vacuum chamber 20, which may be filled with gases of a predetermined mixture, is pumped to a high or ultra-high vacuum. Ion gun 30 generates a beam (in a well-known way) that strikes a selected portion of the sputtering targets 34. The portion of the sputtering targets 34 that is struck may be selected by translating the sputtering targets in a plane generally perpendicular to the beam direction. Atoms and molecules (hereafter called "atoms") are released into the vacuum chamber 20 when a target is struck by the ion beam. The sputtering targets 34 generally include one material having a low index of refraction such as silicon dioxide ($SiO_2$), and one material having a high index of refraction such as titanium dioxide ($TiO_2$).

Figure 2:
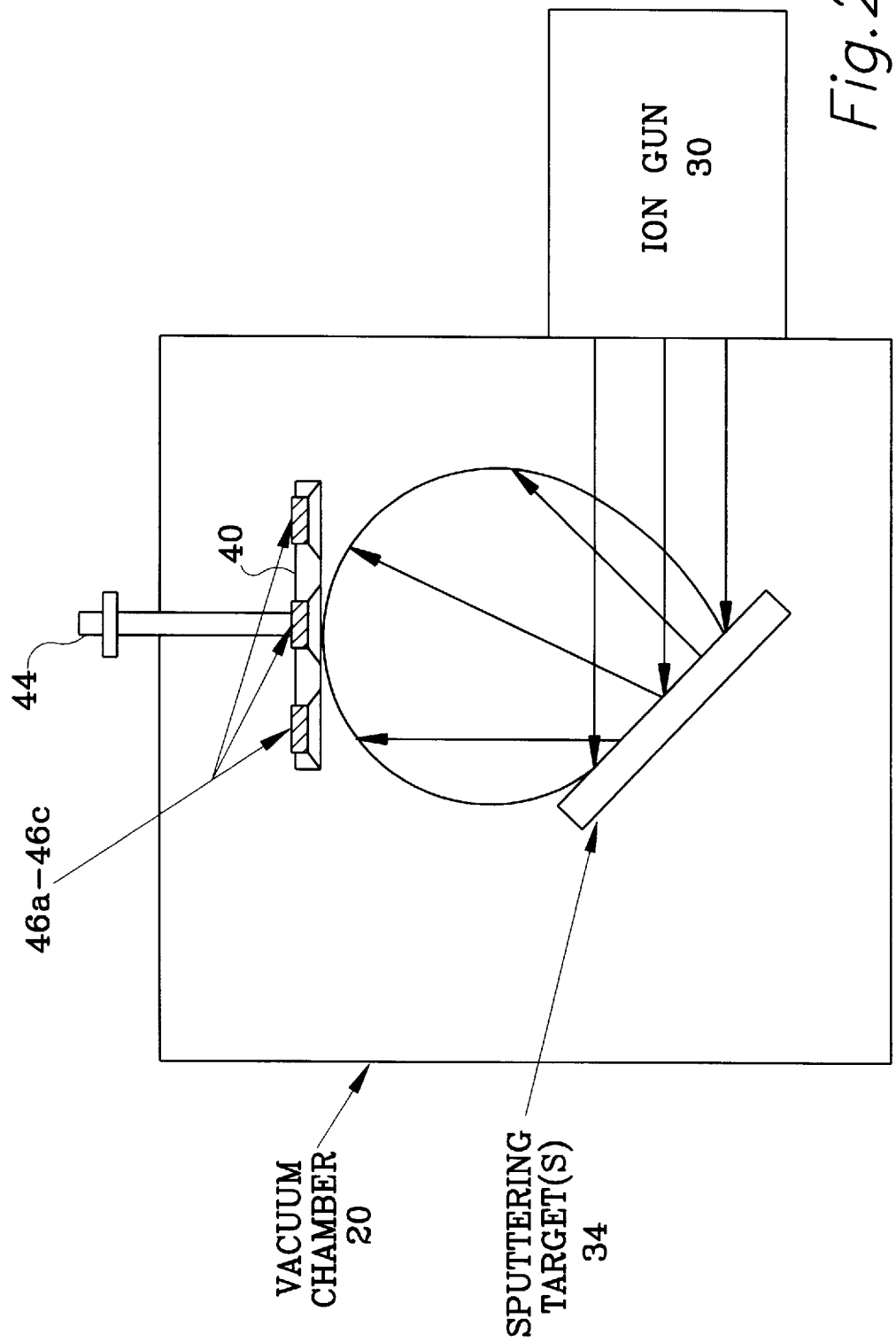
FIG. 2 is a side-view of the system shown in FIG. 1.

Referring now to FIG. 2, there shown is a side-view of the system 10 shown in FIG. 1. As now can be seen, substrate holders 46a–46c are located on wheel 40. Wheel 40 can be made to rotate through connection of a motive means (not shown) to shaft 44.

Figure 3:
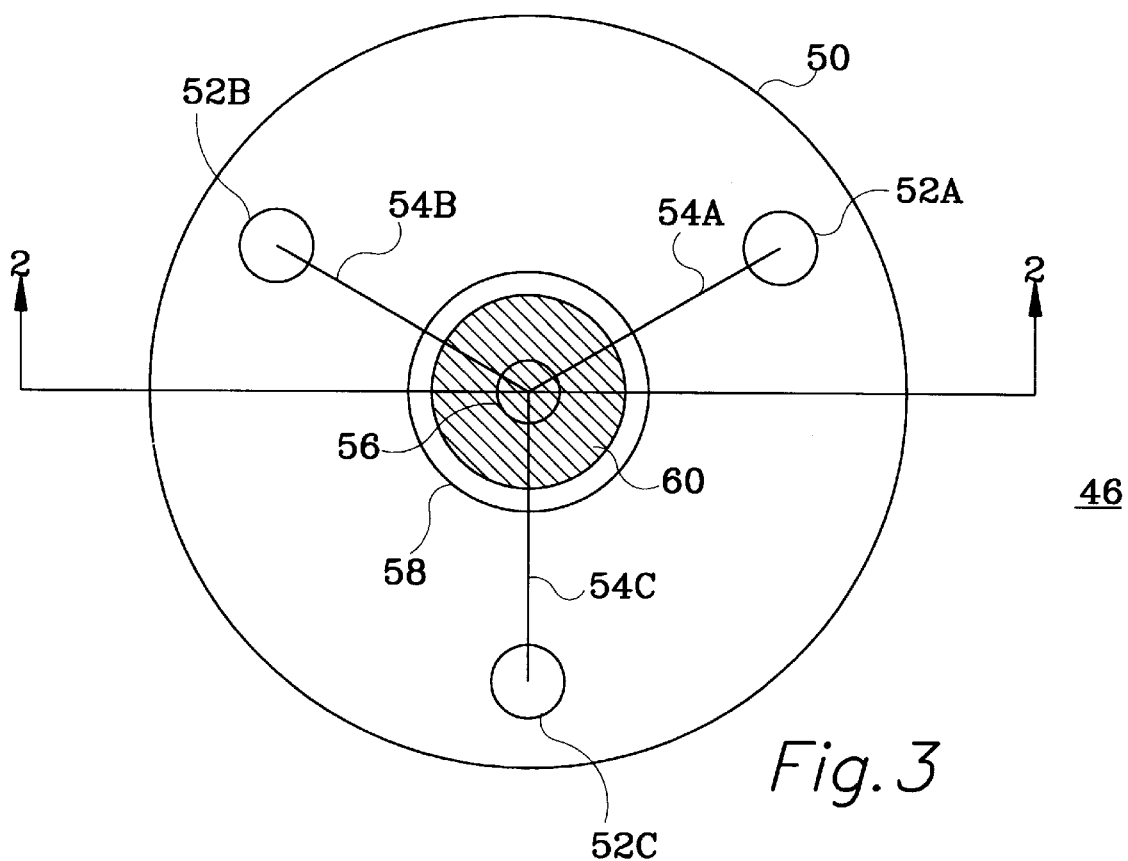
FIG. 3 is a bottom-view of a first inventive substrate holder as shown in FIG. 2.
Figure 4:
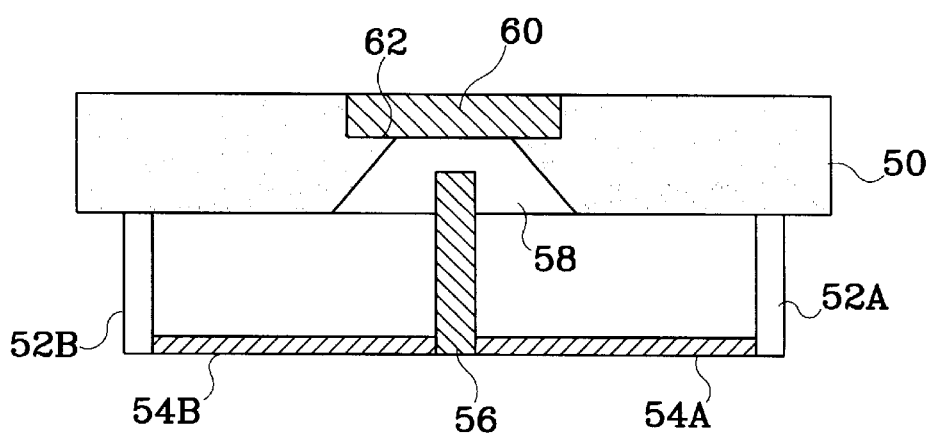
FIG. 4 is a side-view taken along line 2—2 of the substrate holder shown in FIG. 3.

Referring now to FIGS. 3 and 4, there shown are a bottom-view and a side-view of a first inventive substrate holder 46. A substrate 60 is placed in a substrate holding means 62 formed in body 50. Aperture 58 is in communication with one surface of substrate 60 such that when the substrate holder 46 is placed in the mirror deposition system 10, material which has been released from the target has a clear line of sight to the substrate 60. The aperture 58 exposes the substrate 60 to vapor from a distant source. Cylindrical mask 56 is placed in the path between the target and the substrate 60 such that a portion of the target material is intercepted before reaching the substrate surface 60. When the substrate 60 is exposed to a vapor flux from a large vapor source, or a flux from a localized source that (averaged over time) acts like a larger source, the coating beneath the mask 56 develops a curvature. This curvature is a function of the mask diameter, the gap length between the end of the mask 56 and the substrate 60, the angular distribution of the vapor flux impinging the substrate 60, and the coating thickness. The mask 56 is held in place using support posts 52a–52c and support members 54a–54c.

Figure 5:
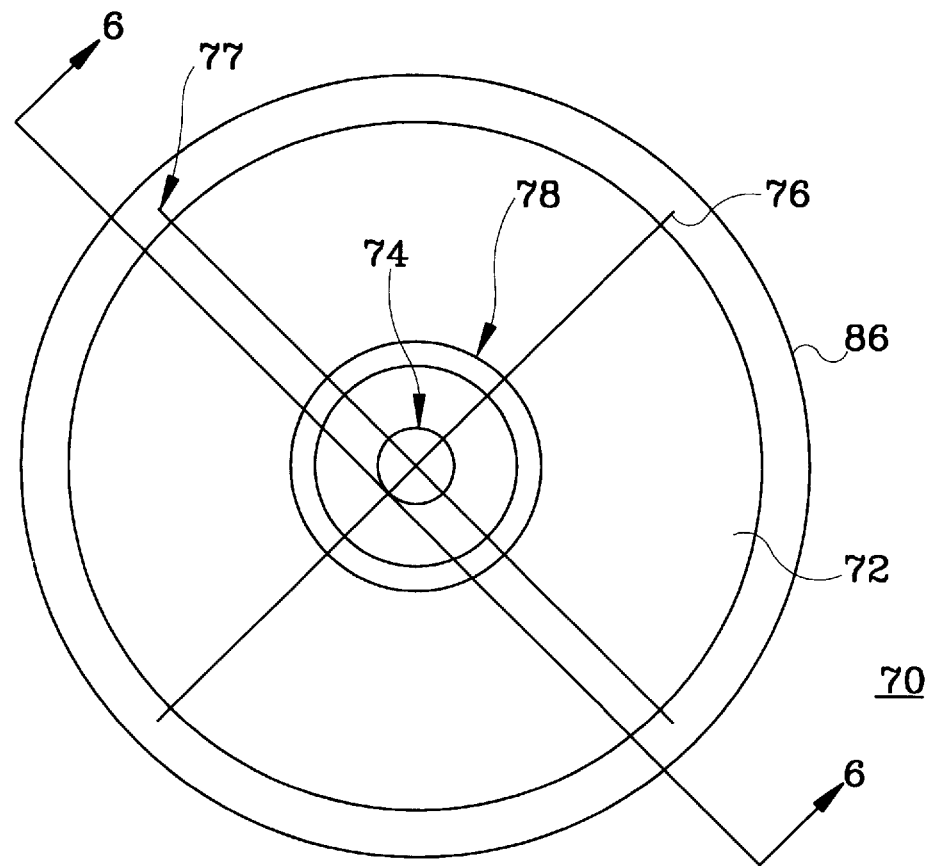
FIG. 5 is a bottom view of a preferred embodiment of the present invention.
Figure 6:
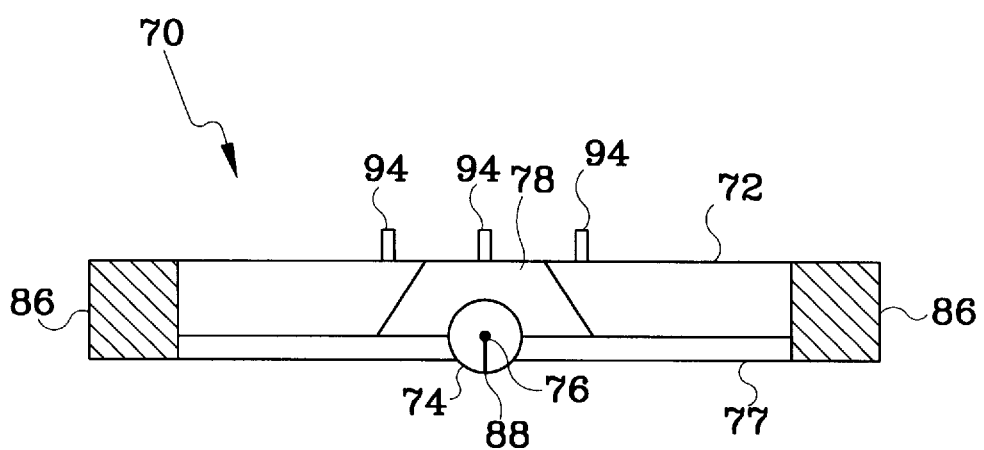
FIG. 6 is a slice view taken along line 6—6 of the substrate holder shown in FIG. 5.

A preferred embodiment of the present invention is shown and described with reference to FIGS. 5 and 6. In FIG. 5, a bottom view of the inventive substrate holder 70 is shown. FIG. 6 is a side slice view of the inventive substrate holder 70. The substrate holder 70 includes body 72, mask 74, wires 76, 77, aperture 78, ring 86 and substrate positioning posts 94. Aperture 78 exposes one side of a substrate (not shown) to material from a vapor source.

Mask 74 is supported at the center of the aperture 78 on crossed wires 76 and 77 which are attached to ring 86. The wires 76 and 77 may be attached by brazing, soldering, clamping or preferably by spot welding. In a preferred embodiment, the masks 74 are stainless steel spheres. Crossed precision slots 88 are formed in the mask 74 by machining, for example wire electrode-discharge-machining. The crossed slots 88 in the mask 74 slide over the crossed wires 76 and 77; gravity holds the mask 74 in position. The substrate 60 is held above the mask 74. The gap length between the substrate 60 and the mask 74 is determined by the mask dimensions, the depth of the slots 88 in the mask 74 and the distance between the wire attachment plane and the substrate.

Spheres with the precision cross slots 88 are suspended a predetermined distance below the substrate surface 60 using fine wire. In a preferred embodiment, 0.004 or 0.006 molybdenum wire is used.

Figure 5A:
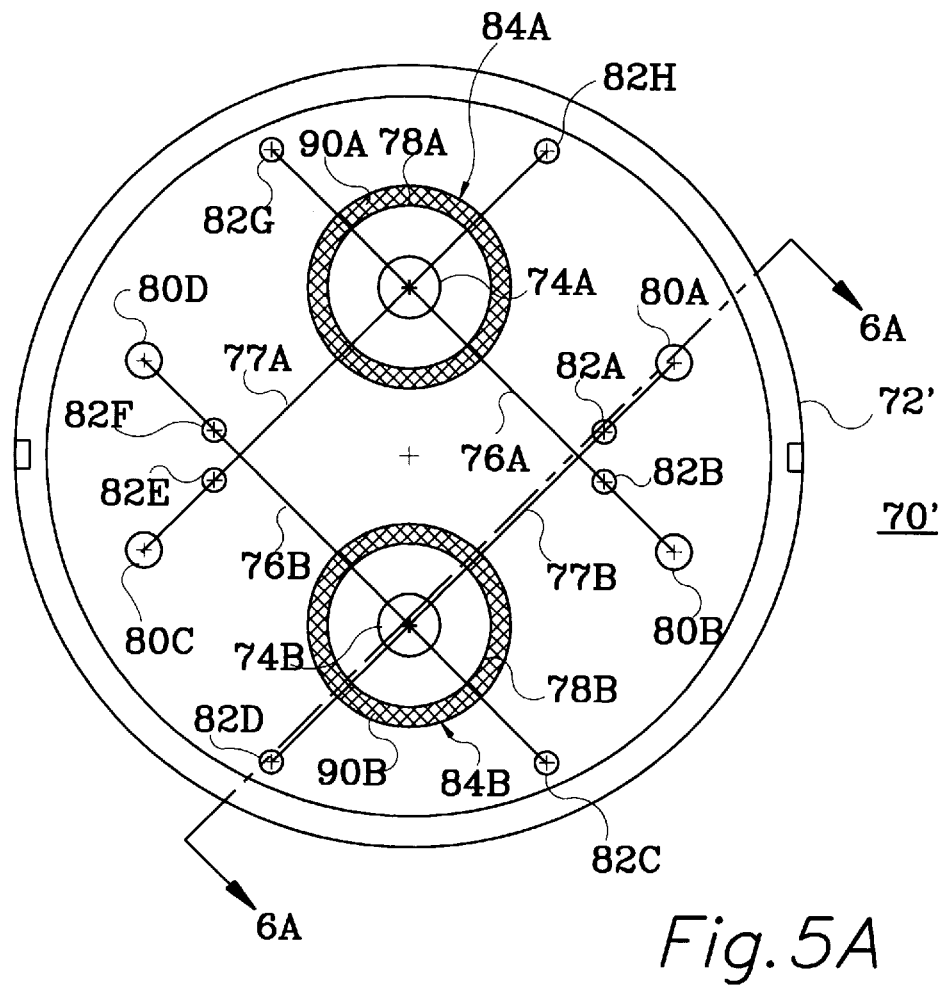
FIG. 5a is a bottom-view of a third inventive substrate holder.
Figure 6A:
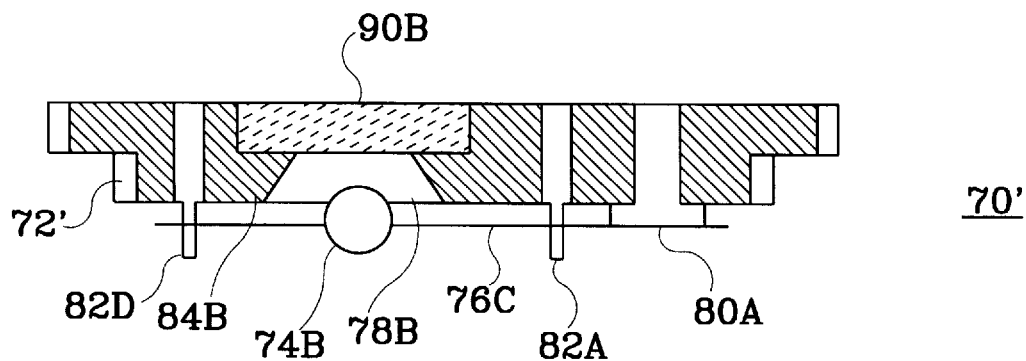

An alternative embodiment of the present invention is shown in FIGS. 5*a* and 6*a*. In FIG. 5*a*, a bottom view of the inventive substrate holder 70' is shown. FIG. 6*a* is a side slice view of the inventive substrate holder 70'. Substrate holder 70' includes body 72', mask 74*a* and 74*b*, wires 76*a, b* and 77*a, b*, apertures 78*a* and 78*b*, tightening screws 80*a*–80*d* and mounting posts 82*a*–82*h*. Body 72' includes pockets 84*a* and 84*b* for supporting substrate 90*a* and 90*b* therein. The substantive difference between this embodiment and the embodiment shown in FIGS. 5 and 6 is that the mask 74*a* is supported on wires 76*a, b* and 77*a, b* which are supported by mounting posts 82*a*–82*h* and tightening screws 80*a*–80*d*.

Figure 7:
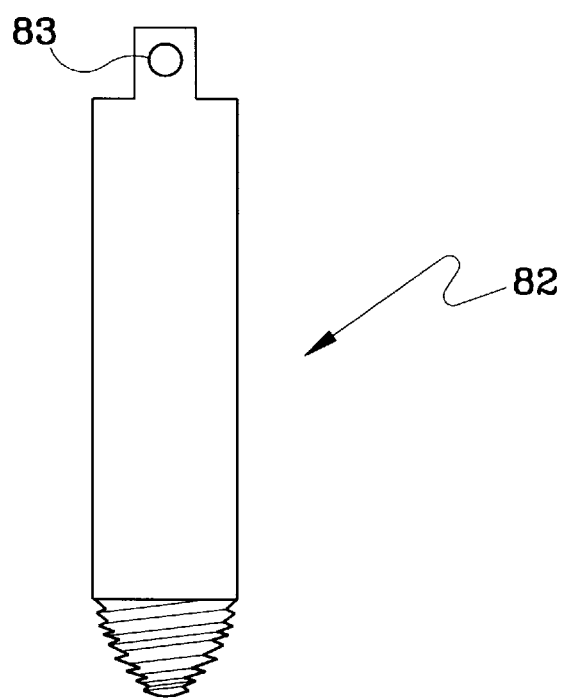
FIG. 7 is a side-view of a tightening post 80 shown in FIGS. 5 and 6.

Referring now to FIG. 7, there shown is a mounting post 82 as used in FIGS. 5 and 6. Note that it consists of a screw head that has been machined off and a hole 83 has been drilled through the shaft of the screw 82 for supporting the wire.

The high scatter problem is minimized by using spherical masks 56 as seen in FIG. 6, particularly when "an energetic particle deposition" process is used to deposit the curved surface. Spherical masks 56 maximize exposure of the critical surface at the mirror center to energetic particle (e.g., ion) bombardment. This bombardment increases the mobility of "adatoms" (atoms condensed from a vapor stream or from a background gas) which is essential for growing smooth, dense, low scatter films at relatively low temperature.

Scatter is also partly a function of the material used to deposit the curved surface. Multilayer dielectric mirrors deposited on curved bases consisting of pure deposited $SiO_2$, or of multilayers of $SiO_2$ and $TiO_2/5$ wt. % $SiO_2$, or of $SiO_2$ and $ZrO_2/10$ wt. % $SiO_2$, exhibit very high scatter at the mirror center. On the other hand, mirrors deposited on curves deposited using straight $TiO_2/5$ wt. % $SiO_2$, or straight $ZrO_2/10$ wt. % $SiO_2$, exhibit quite low scatter. Zirconium/silica composite is preferred over titania/silica because it can be baked to approximately 500° C. without recrystallizing. Another zirconia to silica ratio, or another glassy material may further reduce scatter.

Figure 8A:
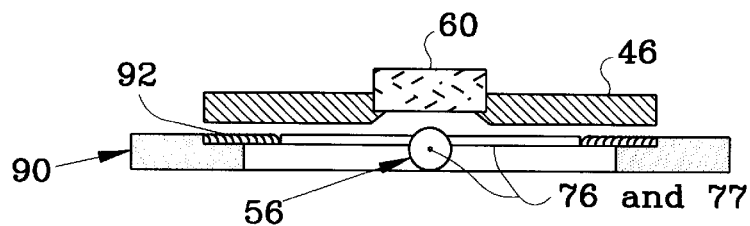
FIG. 8a is a side-view of the substrate holder with the mask between the target material and the substrate.
Figure 8B:
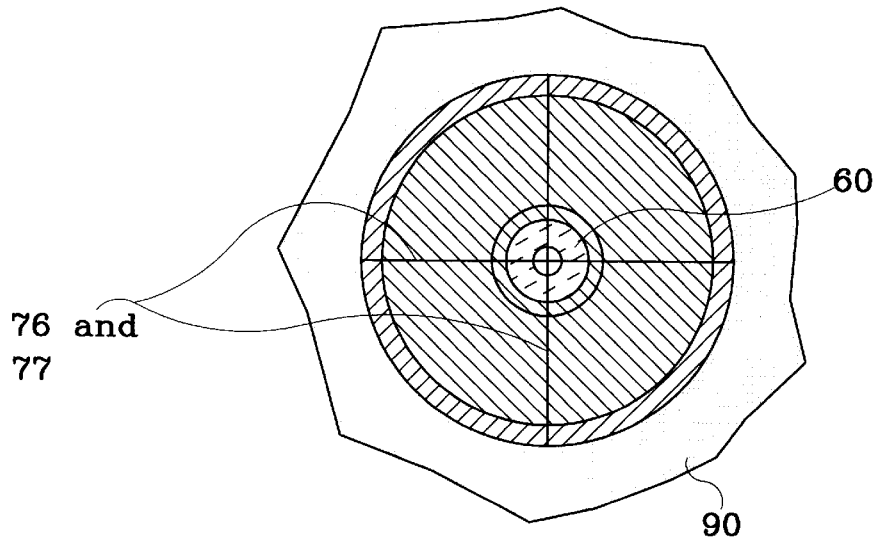
FIG. 8b is a bottom-view of the substrate holder with the mask between the target material and the substrate.
Figure 8C:
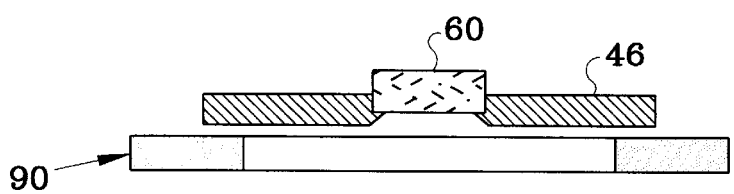
FIG. 8c is a side-view of the substrate holder with the mask removed.
Figure 8D:
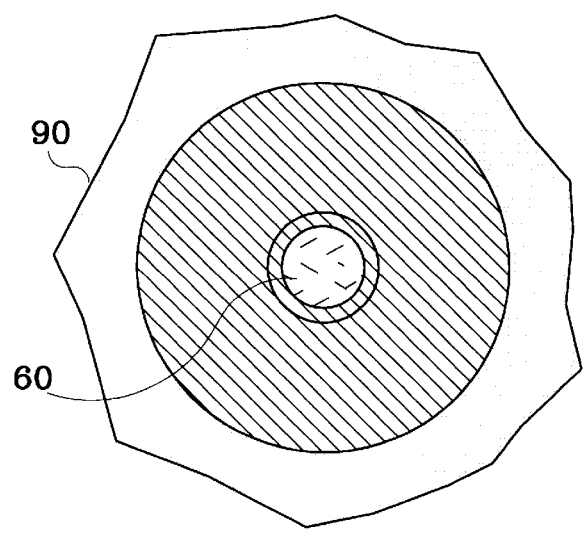
FIG. 8d is a bottom-view of the substrate holder with the mask removed.

A further benefit to the present apparatus is that deposited curved mirrors can be fabricated in a single pump down. This was done by rotating or translating the masking elements 56 with respect to the substrates 60 after forming a surface of a desired curvature. FIGS. 8*a* and 8*b* show the substrate holder 46 for depositing the curve on the substrate 60 through the mask 56. The wires 76 and 77 that support the mask 56 are mounted on a separate plate 92 that seats in a pocket of the moveable plate 90. After the curve is deposited onto the substrate 60, the mask 56 is removed by translating or rotating it out of the way as seen in FIGS. 8*c* and 8*d*. With the mask 56 out of the way, the mirror (not shown) is deposited onto the curved substrate 60.

For 1.2-meter (nominal) curves, the best results were obtained using a 13.55-cm (3/16-inch) spherical mask 56 with a gap of approximately 0.127-cm between the mask 56 and the substrate 60. Scatter increases for shorter gaps and decreases for longer gaps. However, using a longer gap requires more deposition time to produce a given curvature. For a 13.55-cm (3/16 inch) spherical mask 56 spaced 0.127-cm from the substrate 60, the radius of curvature, in meters, is given by R=N/t, where N is a proportionality constant and t is the film thickness, in microns, that would have been deposited in the absence of the mask 56.

The foregoing has been a description of a novel and non-obvious method and apparatus for making curved laser mirrors. The Applicant has provided the foregoing description by way of example not limitation. The Applicant defines this invention through the claims appended hereto.

The embodiments of the invention in which an exclusive property or right is claimed are defined as follows:

1. Masking apparatus for forming a deposited curved coating on a substrate, comprising:

a body having means for supporting the substrate; and a mask having a spherical shape suspended over the substrate by support means at a predetermined distance from said substrate.

2. The apparatus of claim 1, wherein:

said mask is made from stainless steel.

3. The apparatus of claim 1, wherein:

said mask is a sphere.

4. The apparatus of claim 1, wherein said mask is a sphere having a diameter between 0.25 and 1.27 centimeters.

5. The apparatus of claim 1, wherein:

a distance between said substrate and said mask is between 0.064 and 0.254 centimeters.

6. The apparatus of claim 1, further comprising:

support means connected to the body for supporting said mask.

7. The apparatus of claim 6, wherein:

said mask further includes at least one groove therein for receiving said support means.

8. The apparatus of claim 6, wherein:

the support means comprises at least one wire.

9. The apparatus of claim 8, wherein:

the wire is made of molybdenum.

10. The apparatus of claim 6, wherein:

said support means comprises two crossed wires.

11. The apparatus of claim 10, wherein:

said mask includes crossed grooves for receiving said crossed wire support means.

12. The apparatus of claim 10 wherein:

said wires are attached to said support means.

13. The apparatus of claim 7, further comprising:

a plurality of support posts for supporting said mask support means wherein said plurality of support posts are connected to the body.

14. The apparatus of claim 13, wherein:

said support posts comprise screws having a shaft, said shaft having a hole formed therethrough for receipt of said support means, said body having holes formed therein for receiving said screws wherein said screws of said support posts are fastened to the body and said support means travel through said hole in said shaft of said support posts.

\* \* \* \* \*

UNITED STATES PATENT AND TRADEMARK OFFICE
CERTIFICATE OF CORRECTION

PATENT NO. : 5,843,235

DATED : December 1, 1998

INVENTOR(S) : Clark Bergman, Thomas M. Crook

It is certified that error appears in the above-identified patent and that said Letters Patent is hereby corrected as shown below:

On the title page, item [54] and col. 1 line 2.
In the Title, cancel "Curver" and substitute --Curved--.

Signed and Sealed this

Sixteenth Day of March, 1999

Attest:

Q. TODD DICKINSON

*Attesting Officer*     *Acting Commissioner of Patents and Trademarks*